(12) United States Patent
Chan et al.

(10) Patent No.: US 12,388,034 B2
(45) Date of Patent: Aug. 12, 2025

(54) CHIP PACKAGE AND MANUFACTURING METHOD THEREOF

(71) Applicant: XINTEC INC., Taoyuan (TW)

(72) Inventors: Chieh Chan, Taoyuan (TW); Yen-Chen Lee, Taipei (TW)

(73) Assignee: XINTEC INC., Taoyuan (TW)

( * ) Notice: Subject to any disclaimer, the term of this patent is extended or adjusted under 35 U.S.C. 154(b) by 484 days.

(21) Appl. No.: 17/750,228

(22) Filed: May 20, 2022

(65) Prior Publication Data

US 2022/0384373 A1 Dec. 1, 2022

Related U.S. Application Data

(60) Provisional application No. 63/192,888, filed on May 25, 2021.

(51) Int. Cl.
*H01L 23/48* (2006.01)
*H01L 21/768* (2006.01)
(Continued)

(52) U.S. Cl.
CPC ........ *H01L 24/05* (2013.01); *H01L 21/76898* (2013.01); *H01L 23/481* (2013.01); *H01L 23/5283* (2013.01); *H01L 23/5286* (2013.01); *H01L 23/535* (2013.01); *H01L 24/02* (2013.01); *H01L 24/03* (2013.01); *H01L 24/06* (2013.01); *H01L 24/08* (2013.01); *H01L 24/48* (2013.01); *H01L 2224/02313* (2013.01); *H01L 2224/02331* (2013.01); *H01L 2224/02372* (2013.01); *H01L 2224/02375* (2013.01); *H01L 2224/02381* (2013.01); *H01L 2224/03002* (2013.01); *H01L 2224/03462* (2013.01); *H01L 2224/05008* (2013.01); *H01L 2224/05009* (2013.01); *H01L 2224/05083* (2013.01);
(Continued)

(58) Field of Classification Search
CPC ..... H01L 23/481; H01L 23/535; H01L 23/50; H01L 23/5283; H01L 23/5286; H01L 21/76898; H01L 2224/05548
See application file for complete search history.

(56) References Cited

U.S. PATENT DOCUMENTS 10,153,273 B1 * 12/2018 Tsai .................. H01L 21/28587

FOREIGN PATENT DOCUMENTS

| CN | 107591375 A | 1/2018 |
|---|---|---|
| CN | 110491859 A | 11/2019 |

(Continued)

*Primary Examiner* — Zandra V Smith
*Assistant Examiner* — Molly K Reida
(74) *Attorney, Agent, or Firm* — LIU & LIU

(57) ABSTRACT

A chip package includes a semiconductor structure and a redistribution layer. The semiconductor structure has a substrate, a first isolation layer, and a lower ground pad. The substrate has a top surface, a bottom surface opposite to the top surface, a through hole through the top surface and the bottom surface, and a sidewall surrounding the through hole. The first isolation layer is located on the top surface of the substrate, and the lower ground pad is located in the through hole. The redistribution layer extends from the bottom surface of the substrate to the lower ground pad along the sidewall. The redistribution layer covers the entire bottom surface of the substrate and electrically connects the lower ground pad.

17 Claims, 18 Drawing Sheets

(51) Int. Cl.
*H01L 23/00* (2006.01)
*H01L 23/528* (2006.01)
*H01L 23/535* (2006.01)

(52) U.S. Cl.
CPC ............... *H01L 2224/05147* (2013.01); *H01L 2224/05155* (2013.01); *H01L 2224/05166* (2013.01); *H01L 2224/05548* (2013.01); *H01L 2224/05561* (2013.01); *H01L 2224/05573* (2013.01); *H01L 2224/05644* (2013.01); *H01L 2224/06182* (2013.01); *H01L 2224/08225* (2013.01); *H01L 2224/48108* (2013.01); *H01L 2224/48227* (2013.01)

(56) References Cited

FOREIGN PATENT DOCUMENTS

| | | |
|---|---|---|
| TW | 201943147 | 11/2019 |
| TW | 202013653 | 4/2020 |

\* cited by examiner

CHIP PACKAGE AND MANUFACTURING METHOD THEREOF

RELATED APPLICATIONS

This application claims priority to U.S. Provisional Application Ser. No. 63/192,888, filed May 25, 2021, which is herein incorporated by reference.

BACKGROUND

Field of Invention

The present disclosure relates to a chip package and a manufacturing method of the chip package.

Description of Related Art

Generally, a top surface of a chip package having a silicon substrate or a SOI (silicon on insulator) substrate has plural conductive pads. After the chip package is bonded to a printed circuit board, a wire bonding process can be used to electrically connect the conductive pads to the printed circuit board. A portion of these conductive pads is related to a grounding function of the chip package, and another portion of the conductive pads is related to the function of the chip package itself (e.g., power processing, fingerprint recognition, image processing, etc.).

However, if the conductive pads used for grounding and other functional conductive pads are connected to the printed circuit board by wire bonding, signal interference and physical interference are likely to occur. Moreover, a transmission distance is long and a resistance value is high, thereby affecting the performance. In addition, due to a limited area of the chip package, disposing the grounding conductive pad on the top surface of the chip package is an inconvenient factor for chip miniaturization.

SUMMARY

One aspect of the present disclosure provides a chip package.

According to some embodiments of the present disclosure, a chip package includes a semiconductor structure and a redistribution layer. The semiconductor structure has a substrate, a first isolation layer, and a lower ground pad. The substrate has a top surface, a bottom surface opposite to the top surface, a through hole through the top surface and the bottom surface, and a sidewall surrounding the through hole. The first isolation layer is located on the top surface of the substrate, and the lower ground pad is located on the through hole. The redistribution layer extends from the bottom surface of the substrate to the lower ground pad along the sidewall. The redistribution layer covers the entire bottom surface of the substrate and electrically connects the lower ground pad.

In some embodiments, an included angle between the first isolation layer and the lower ground pad of the semiconductor structure is greater than or equal to 90 degrees.

In some embodiments, the substrate further comprises an inner isolation layer, and a portion of the substrate is located between the first isolation layer and the inner isolation layer.

In some embodiments, a thickness of said portion of the substrate is less than half of sum of thicknesses of the first isolation layer and the inner isolation layer.

In some embodiments, the semiconductor structure further includes a second isolation layer located on the first isolation layer and surrounds the lower ground pad.

In some embodiments, the semiconductor structure further includes a third isolation layer located on the second isolation layer.

In some embodiments, the semiconductor structure further includes an upper ground pad embedded in the third isolation layer and electrically connected to the lower ground pad.

In some embodiments, the semiconductor structure further includes a fourth isolation layer located on the third isolation layer and having an opening, wherein the upper ground pad is located in the opening.

In some embodiments, the upper ground pad overlaps the lower ground pad in a vertical direction.

In some embodiments, the upper ground pad is free of conductive lines.

In some embodiments, the semiconductor structure further includes a functional conductive pad embedded in the third isolation layer and electrically isolated from the lower ground pad.

In some embodiments, the first isolation layer is a buffer layer, the substrate further includes a semiconductor layer and another buffer layer, and the semiconductor layer is located between the two buffer layers.

Another aspect of the present disclosure provides a manufacturing method of a chip package.

According to some embodiments of the present disclosure, a manufacturing method of a chip package includes bonding, by a temporary bonding layer, a carrier to a semiconductor structure, wherein the semiconductor structure has a substrate, a first isolation layer, and a lower ground pad, and the substrate has a top surface and a bottom surface opposite to the top surface; etching the substrate to form a through hole through the top surface and the bottom surface, such that the substrate has a sidewall surrounding the through hole; etching the first isolation layer in the through hole to expose the lower ground pad; forming a redistribution layer extending from the bottom surface of the substrate to the lower ground pad along the sidewall, wherein the redistribution layer covers the entire bottom surface of the substrate and electrically connects the lower ground pad; and removing the temporary bonding layer and the carrier.

In some embodiments, the manufacturing method of the chip package further includes after bonding the carrier to the semiconductor structure, grinding the bottom surface of the substrate.

In some embodiments, the manufacturing method of the chip package further includes etching the substrate again to laterally expand the through hole after the through hole is formed.

In some embodiments, the manufacturing method of the chip package further includes after etching the first isolation layer in the through hole, forming a seed layer extending from the bottom surface of the substrate to the lower ground pad along the sidewall; and forming a photoresist on the seed layer on the bottom surface of the substrate.

In some embodiments, forming the redistribution layer includes using an electroplating method to form the redistribution layer on the seed layer that is not covered by the photoresist.

In some embodiments, the manufacturing method of the chip package further includes after forming the redistribution layer, removing the photoresist.

In some embodiments, the manufacturing method of the chip package further includes after removing the photoresist, forming an antioxidant layer on the redistribution layer.

In some embodiments, the semiconductor structure further includes an inner isolation layer, and a portion of the substrate is located between the first isolation layer and the inner isolation layer, and the manufacturing method further includes after etching the substrate to form the through hole, etching the inner isolation layer in the through hole, the portion of the substrate, and the first isolation layer to expose the lower ground pad.

In some embodiments, the manufacturing method of the chip package further includes after removing the temporary bonding layer and the carrier, dicing the semiconductor structure.

In the aforementioned embodiments of the present disclosure, since the redistribution layer covers the entire bottom surface of the substrate and electrically connects the lower ground pad, the lower ground pad can electrically connect to a printed circuit board through the redistribution layer without wire bonding, which can avoid signal interference and physical interference with bonding wires on other functional conductive pads. Furthermore, because the lower ground pad is connected to the printed circuit board through the redistribution layer, a transmission distance is shorter and a resistance value is lower, which can improve the performance of the chip package. For the chip package, a thinner substrate can be selected or a thicker substrate can be thinned to use, which is beneficial to miniaturized design and shortened transmission distance. In addition, the redistribution layer can further improve a thermal conductivity, which is helpful for the heat dissipation of the chip package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
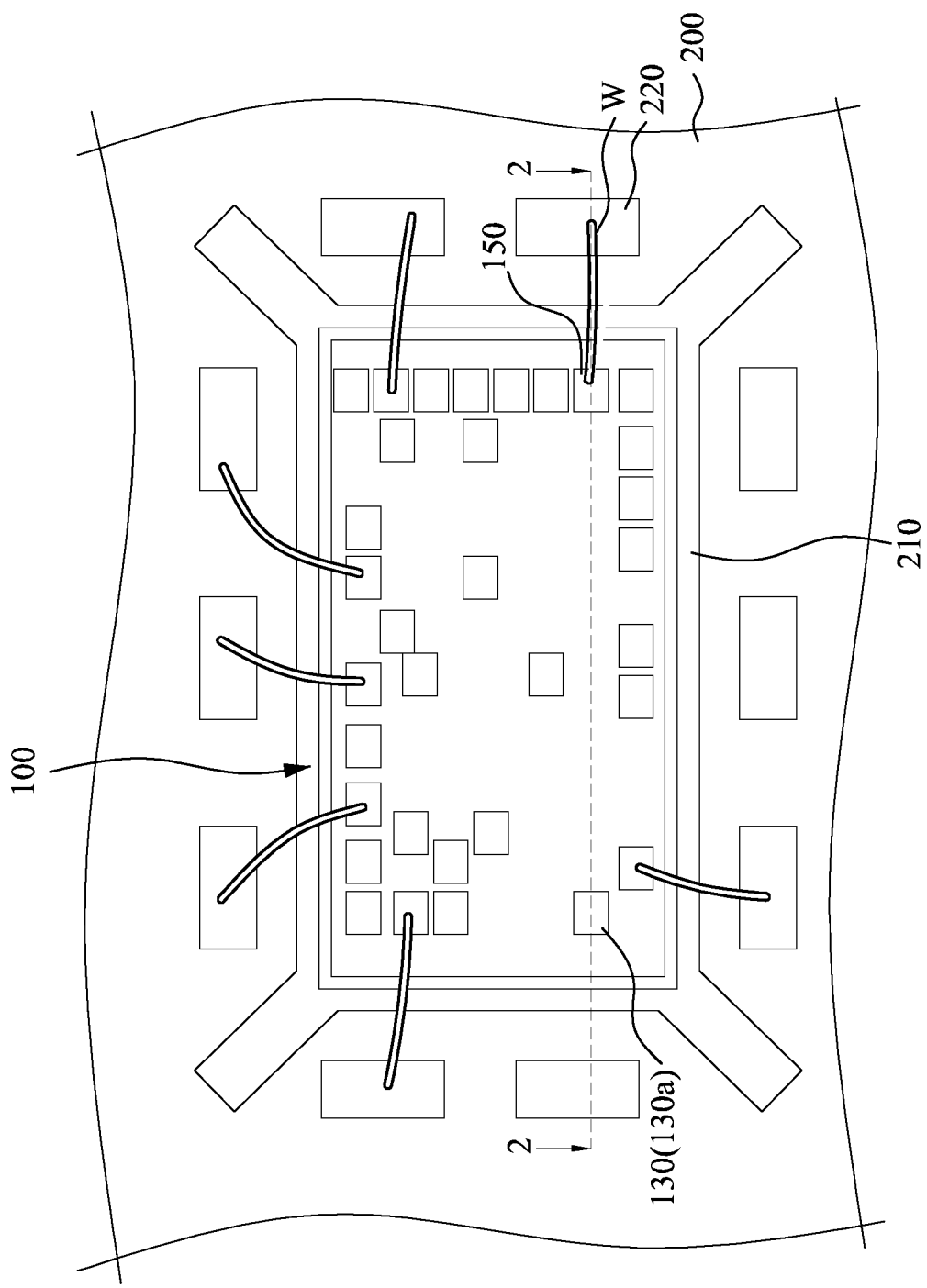
FIG. 1 is a top view of a chip package disposed on a printed circuit board according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same or similar numbers in different drawings represent the same or similar elements formed by the same or similar forming methods using the same or similar materials.

Figure 2:
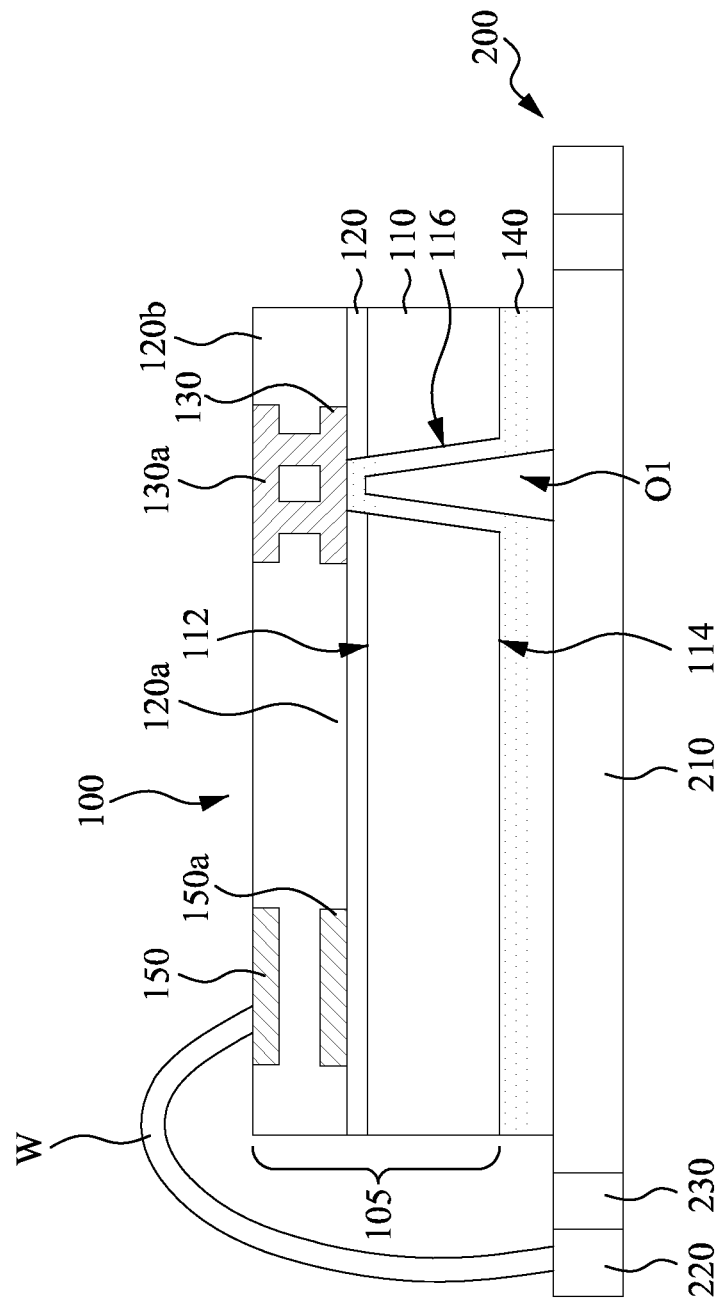
FIG. 2 is a cross-sectional view of the chip package and the printed circuit board taken along line 2-2 of FIG. 1.

FIG. 1 is a top view of a chip package 100 disposed on a printed circuit board 200 according to one embodiment of the present disclosure. FIG. 2 is a cross-sectional view of the chip package 100 and the printed circuit board 200 taken along line 2-2 of FIG. 1. As shown in FIG. 1 and FIG. 2, the chip package 100 includes a semiconductor structure 105 and a redistribution layer 140. The semiconductor structure 105 has a substrate 110, a first isolation layer 120, and a lower ground pad 130. The substrate 110 has a top surface 112, a bottom surface 114 opposite to the top surface 112, a through hole O1 through the top surface 112 and the bottom surface 114, and a sidewall 116 surrounding the through hole O1. In some embodiments, the substrate 110 may be a silicon substrate. In alternative embodiments, the substrate 110 may be a SOI (Silicon on insulator) substrate, and the present disclosure is not limited in this regard. The first isolation layer 120 is located on the top surface 112 of the substrate 110, and the lower ground pad 130 is located on the through hole O1. The redistribution layer 140 extends from the bottom surface 114 of the substrate 110 to the lower ground pad 130 along the sidewall 116. The redistribution layer 140 may be a combination of plural metal layers which are simplified for clarity in drawings.

Figure 3:
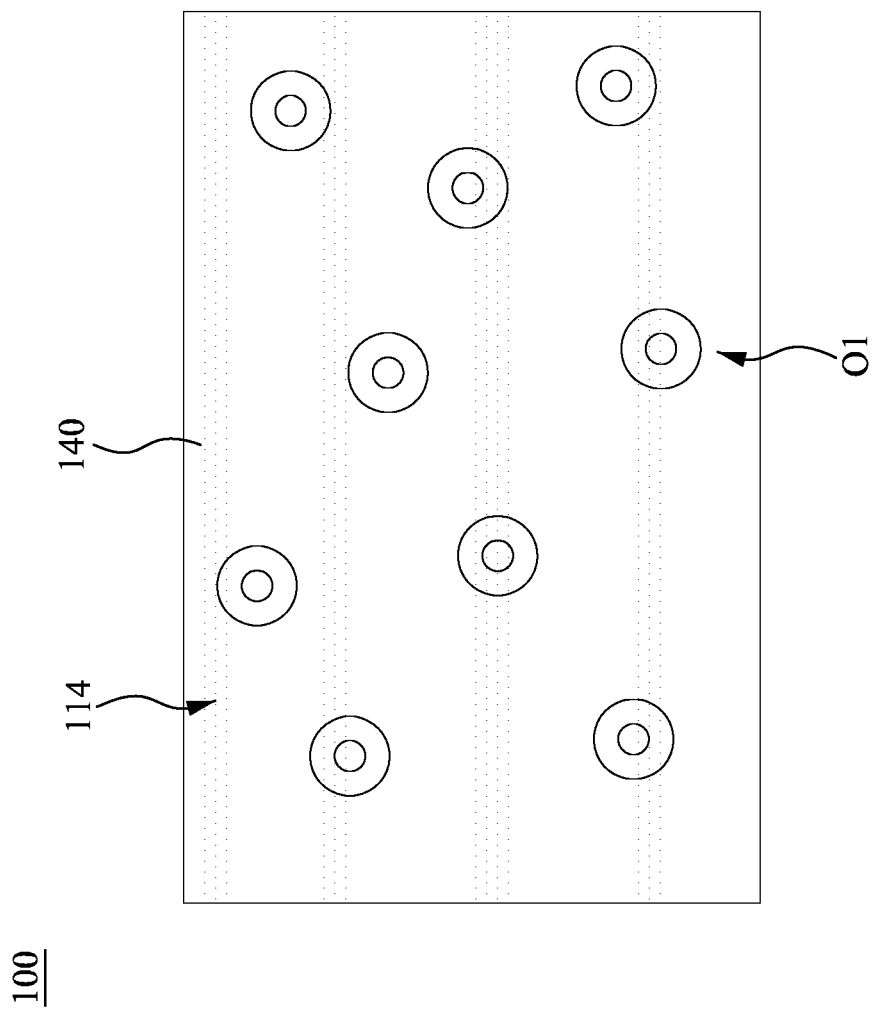
FIG. 3 is a bottom view of the chip package of FIG. 1.

FIG. 3 is a bottom view of the chip package 100 of FIG. 1. As shown in FIG. 2 and FIG. 3, the redistribution layer 140 covers the entire bottom surface 114 of the substrate 110 and electrically connects the lower ground pad 130.

Since the redistribution layer 140 covers the entire bottom surface 114 of the substrate 110 and electrically connects the lower ground pad 130, the lower ground pad 130 can electrically connect to the printed circuit board 200 through the redistribution layer 140 without wire bonding, which can avoid signal interference and physical interference with a bonding wire W on other functional conductive pads 150. Furthermore, because the lower ground pad 130 is connected to the printed circuit board 200 through the redistribution layer 140, a transmission distance is shorter and a resistance value is lower, which can improve the performance of the chip package 100. For the chip package 100, a thinner substrate 110 can be selected or a thicker substrate 110 can be thinned to use, which is beneficial to miniaturized design and shortened transmission distance. In addition, the redistribution layer 140 can further improve a thermal conductivity, which is helpful for the heat dissipation of the chip package 100.

In this embodiment, the chip package 100 further includes a second isolation layer 120a, a third isolation layer 120b, and an upper ground pad 130a. The second isolation layer 120a is located on the first isolation layer 120 and surrounds the lower ground pad 130. The third isolation layer 120b is located on the second isolation layer 120a. The first isolation layer 120, the second isolation layer 120a, and the third isolation layer 120b may be made of the same material so as to have no interface. The upper ground pad 130a is embedded in the third isolation layer 120b and is electrically connected to the lower ground pad 130. The upper ground pad 130a overlaps the lower ground pad 130 in a vertical direction. In manufacturing the chip package 100, a connection between the lower ground pad 130 and the redistribution layer 140 may be tested through the upper ground pad 130a to determine whether the connection is normal or abnormal. In addition, the upper ground pad 130a is free of the conductive line W, and can be used to mark the position of the lower ground pad 130.

The semiconductor structure 105 further includes the functional conductive pad 150 embedded in the third isolation layer 120b and electrically isolated from the lower ground pad 130 that is electrically connected to the redistribution layer 140. A wire bonding process is performed on the functional conductive pad 150 so that one end of the conductive line W is located on the functional conductive pad 150 and another end of the conductive line W is located on the printed circuit board 200. The functional conductive pad 150 may be referred to as a conductive pad having functions except grounding.

In addition, the semiconductor structure 105 may have a functional conductive pad 150a that is on the first isolation layer 120 and in the second isolation layer 120a, but the functional conductive pad 150a is not electrically connected to the redistribution layer 140.

In this embodiment, the printed circuit board 200 has a ground pad 210, a functional conductive pad 220, and an insulator 230. The ground pad 210 and the functional conductive pad 220 may be separated by the insulator 230 such that the ground pad 210 is electrically isolated from the functional conductive pad 220. The ground pad 210 and the functional conductive pad 220 may be electrically connected to the redistribution layer 140 and the functional conductive pad 150 of the chip package 100, respectively. The redistribution layer 140 may be in direct contact with the ground pad 210, which is helpful for electric conduction and thermal conduction. The functional conductive pad 150 is electrically connected to the functional conductive pad 220 of the printed circuit board 200 through the conductive line W.

Figure 4:
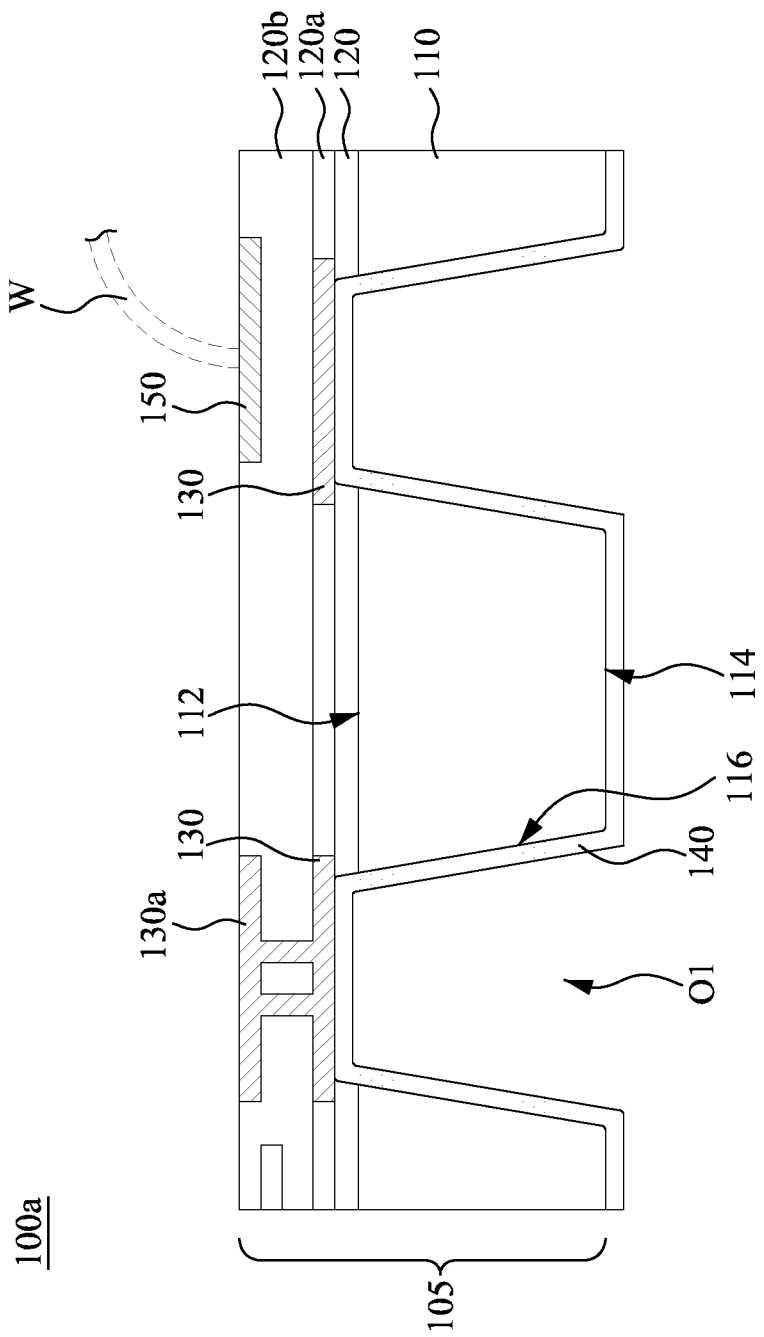
FIG. 4 is a cross-sectional view of a chip package according to another embodiment of the present disclosure.

FIG. 4 is a cross-sectional view of a chip package 100a according to another embodiment of the present disclosure. The chip package 100a includes the semiconductor structure 105 and the redistribution layer 140. The difference between this embodiment and the embodiment of FIG. 2 is that the functional conductive pad 150 above the lower ground pad 130 at the right side of the chip package 100a needs wire bonding, and said lower ground pad 130 is electrically connected to another lower ground pad 130 at the left side of the chip package 100a through the redistribution layer 140. Such a design can realize that a single redistribution layer 140 can be electrically connected to plural lower ground conductive pads 130, which can save the time and cost of traditional wire bonding for grounding.

Figure 5:
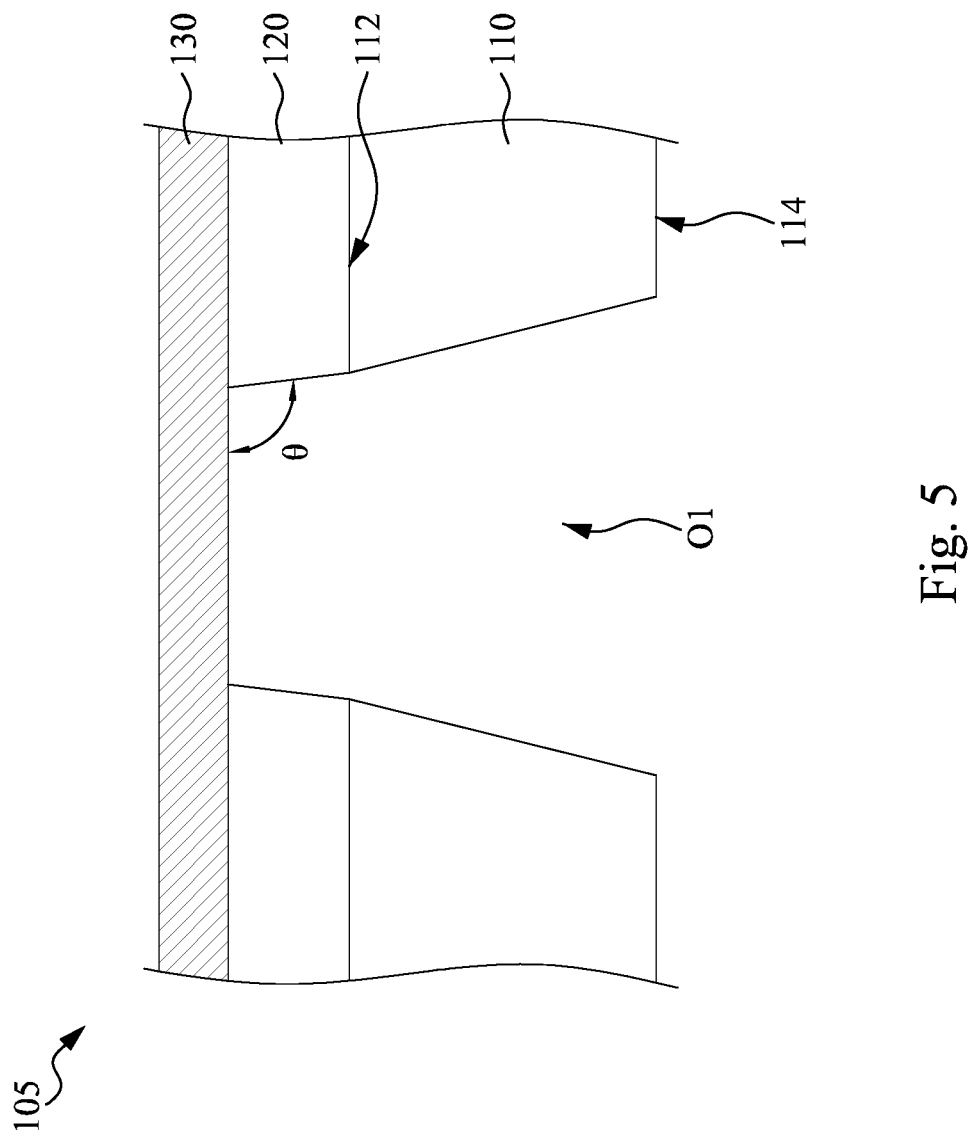
FIG. 5 is a partially enlarged view of the chip package of FIG. 2 at a stage of manufacturing.

FIG. 5 is a partially enlarged view of the chip package 100 of FIG. 2 at a stage of manufacturing. After etching the substrate 110 and the first isolation layer 120 to form the through hole O1, the lower ground conductive pad 130 is exposed through the through hole O1. An included angle θ between the first isolation layer 120 and the lower ground pad 130 of the semiconductor structure 105 is greater than or equal to 90 degrees, thereby preventing the subsequently formed redistribution layer 140 (see FIG. 2) from being broken at turning positions.

Figure 6:
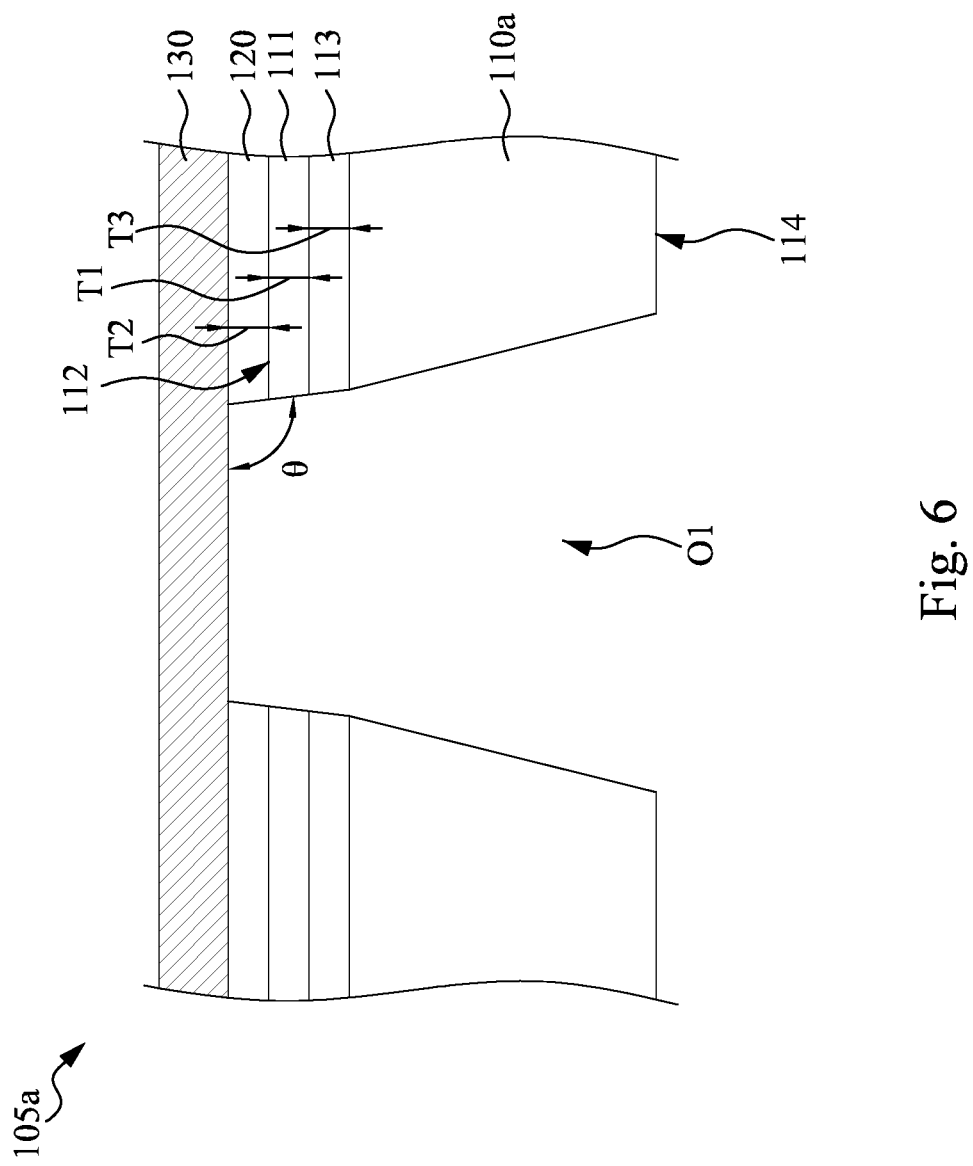
FIG. 6 is a partially enlarged view of a chip package at a stage of manufacturing according to another embodiment of the present disclosure.

FIG. 6 is a partially enlarged view of a chip package 100 at a stage of manufacturing according to another embodiment of the present disclosure. The difference between this embodiment and the embodiment of FIG. 5 is that the substrate 110a of the semiconductor structure 105a of FIG. 6 further includes an inner isolation layer 113, and a portion 111 of the substrate 110a is located between the first isolation layer 120 and the inner isolation layer 113. A thickness T1 of said portion 111 of the substrate 110a is less than half of sum of thicknesses of the first isolation layer 120 and the inner isolation layer 113 (i.e., half of sum of a thickness T2 and a thickness T3). As a result of such a design, because the portion 111 of the substrate 110a is thin, the portion 111 may be etched when etching the inner isolation layer 113 and the first isolation layer 120. Moreover, an included angle θ between the first isolation layer 120 and the lower ground pad 130 of the semiconductor structure 105 is greater than or equal to 90 degrees, thereby preventing the subsequently formed redistribution layer 140 (see FIG. 2) from being broken at turning positions. In some embodiments, the first isolation layer 120 is a buffer layer, the substrate 110a further includes a semiconductor layer 111 and another buffer layer 113, and the semiconductor layer 111 is located between the two buffer layers 120 and 113.

In the following description, a manufacturing method of a chip package will be explained.

Figure 7:
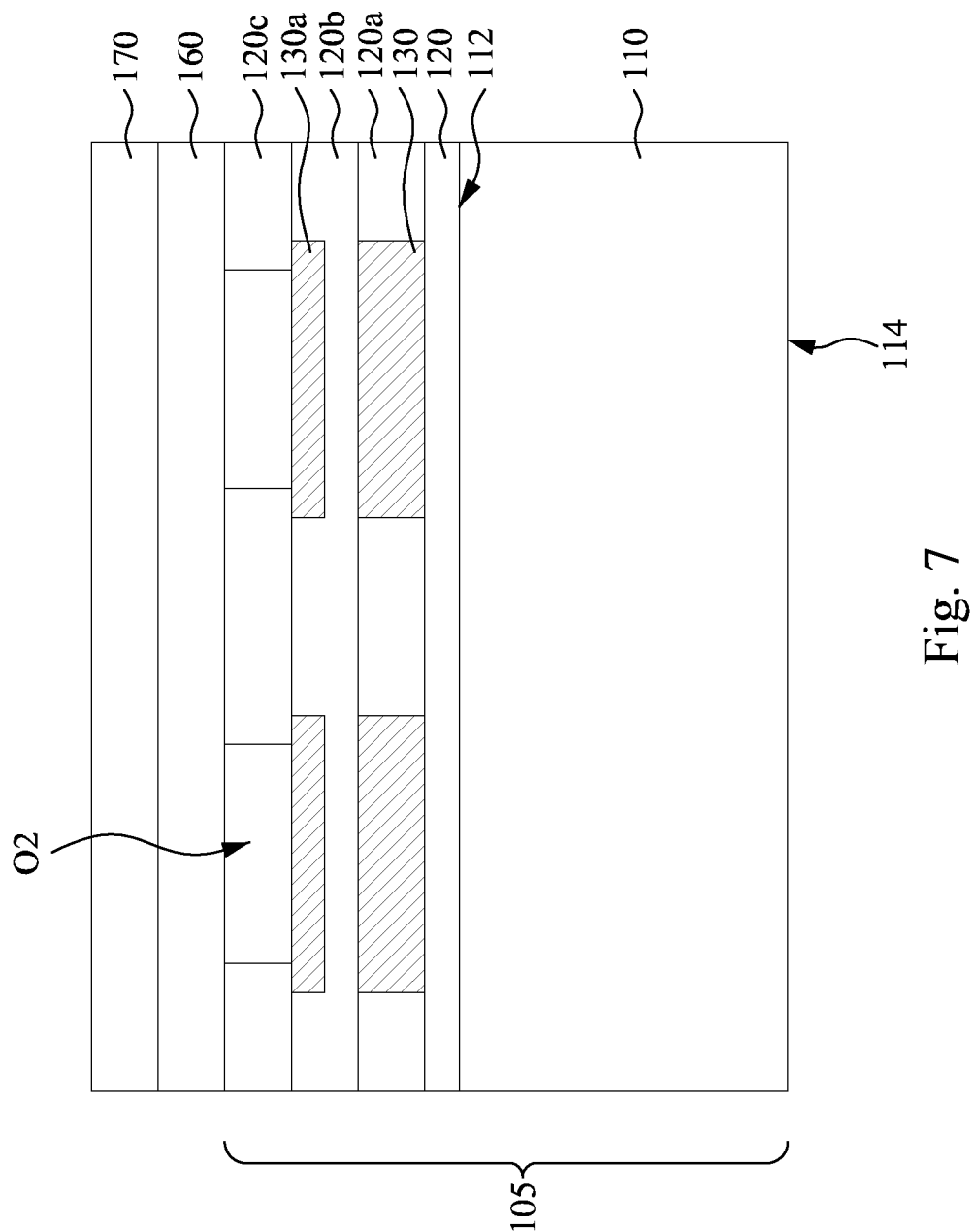
FIGS. 7 to 18 are cross-sectional views at various stages of a manufacturing method of a chip package according to one embodiment of the present disclosure.
Figure 8:
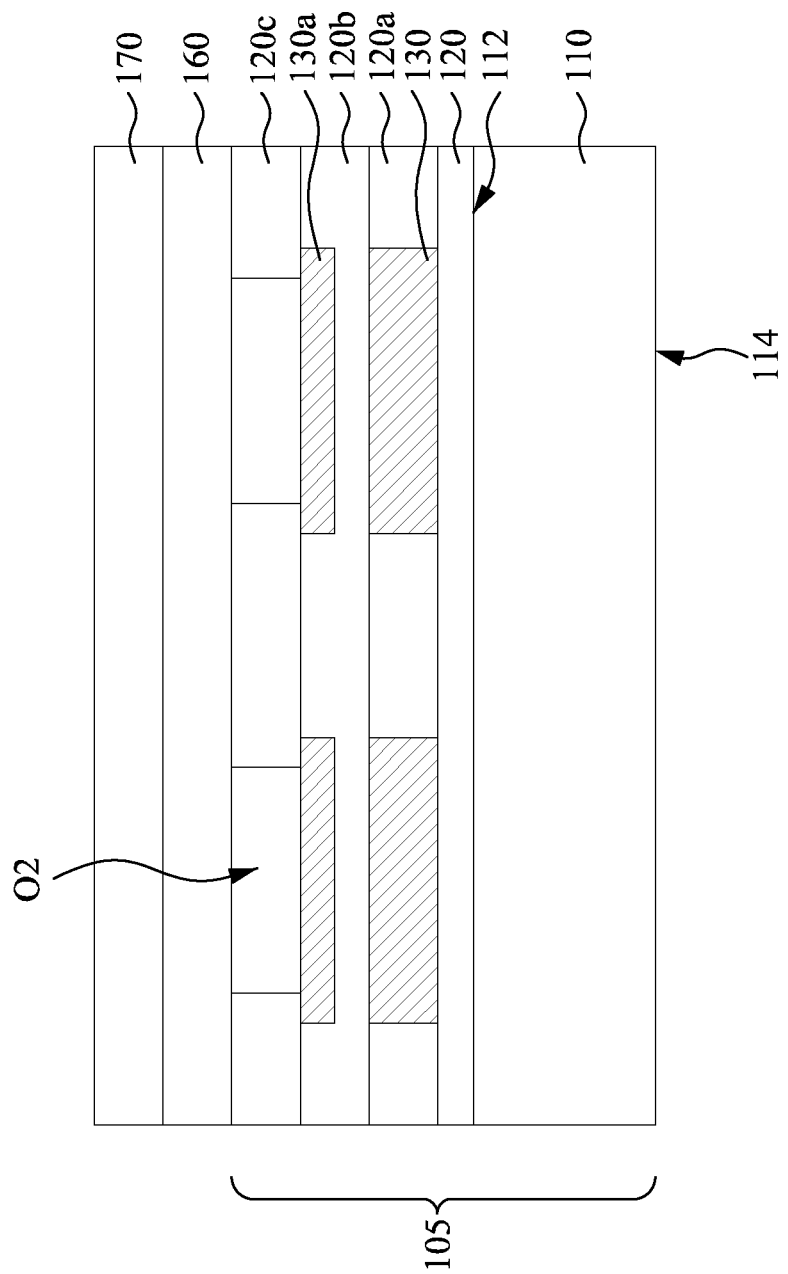

FIGS. 7 to 18 are cross-sectional views at various stages of a manufacturing method of a chip package according to one embodiment of the present disclosure. As shown in FIG. 7 and FIG. 8, firstly, bonding, by a temporary bonding layer 160, a carrier 170 to the semiconductor structure 105, wherein the semiconductor structure 105 has the substrate 110, the first isolation layer 120, the second isolation layer 120a, the third isolation layer 120b, the lower ground pad 130, and the upper ground pad 130a. The substrate 110 is a silicon substrate, for example. The substrate 110 has the top surface 112 and the bottom surface 114 opposite to the top surface 112. In this embodiment, the semiconductor structure 105 further includes a fourth isolation layer 120c located on the third isolation layer 120b and having an opening O2, wherein the upper ground pad 130a is located in the opening O2. The fourth isolation layer 120c is optional. After the carrier 170 is bonded to the semiconductor structure 105, the bottom surface 114 of the substrate 110 may be ground to thin the substrate 110.

Figure 9:
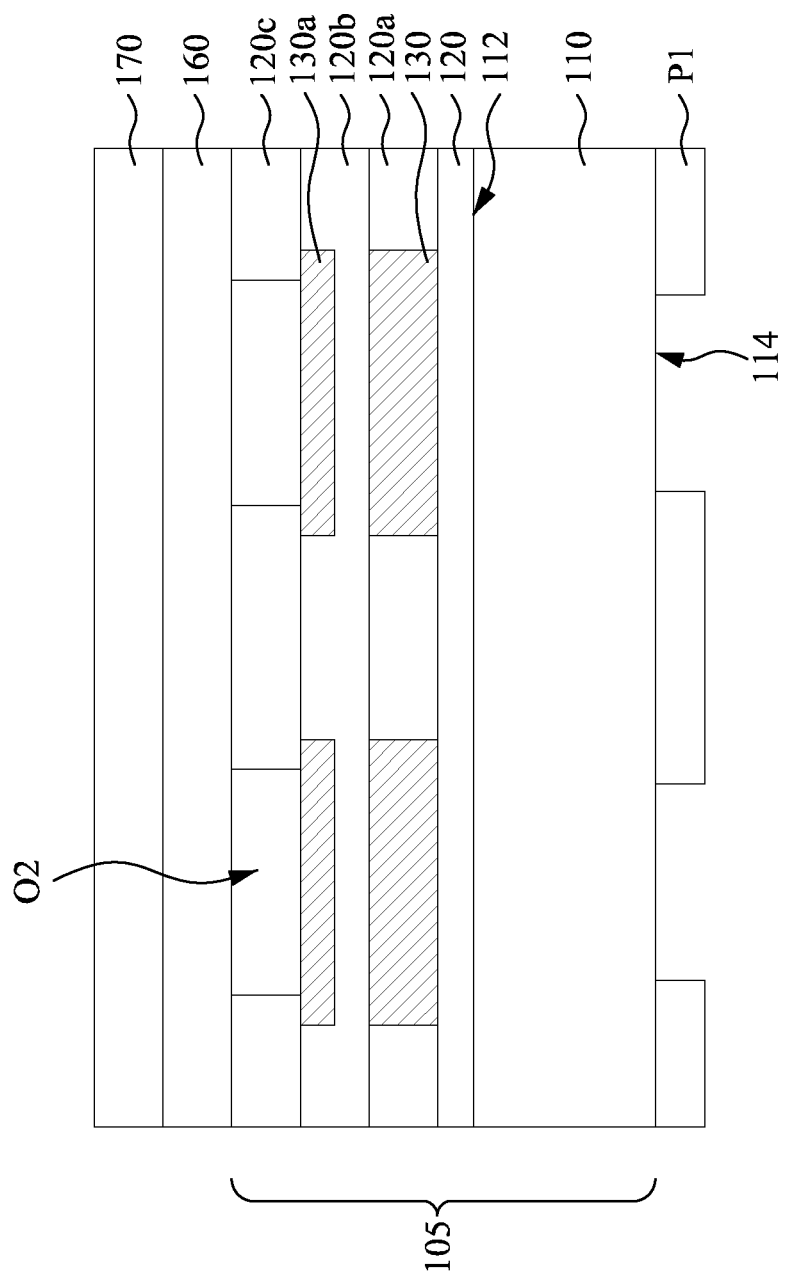
Figure 10:
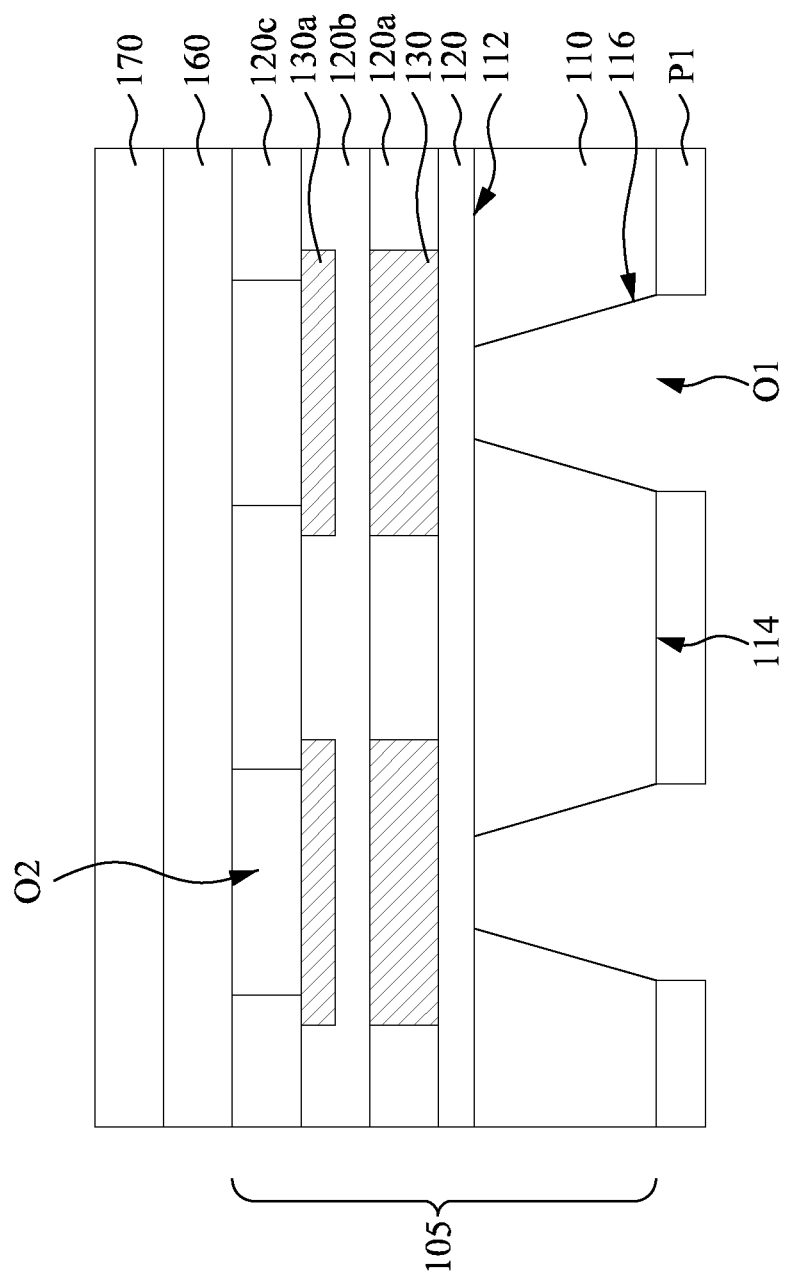
Figure 11:
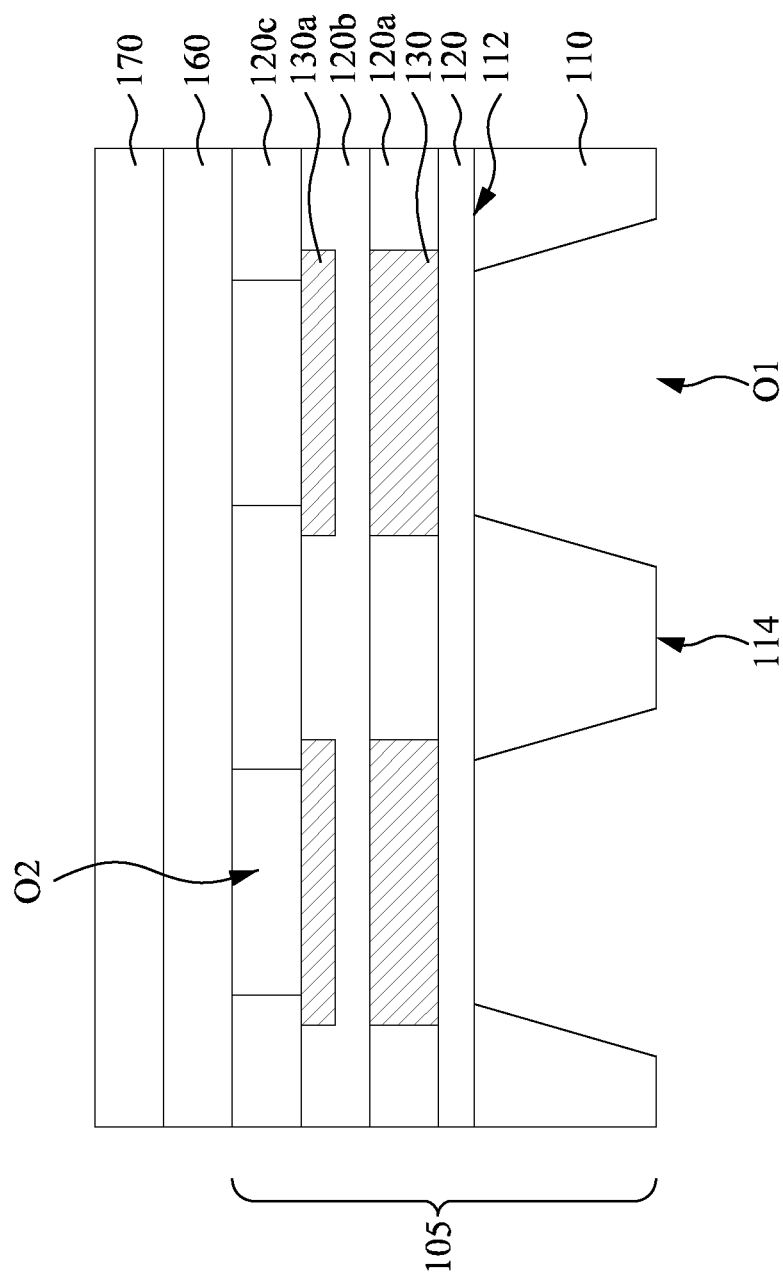

As shown in FIG. 9 and FIG. 10, afterwards, a photoresist P1 may be formed on the bottom surface 114 of the substrate 110, and then the substrate 110 is etched to form the through hole O1 through the top surface 112 and the bottom surface 114, such that the substrate 110 has the sidewall 116 surrounding the through hole O1. In some embodiments, the substrate 110 may be etched again to laterally expand the through hole O1, as shown in FIG. 11. After forming the through hole O1, the photoresist P1 may be removed.

Figure 12:
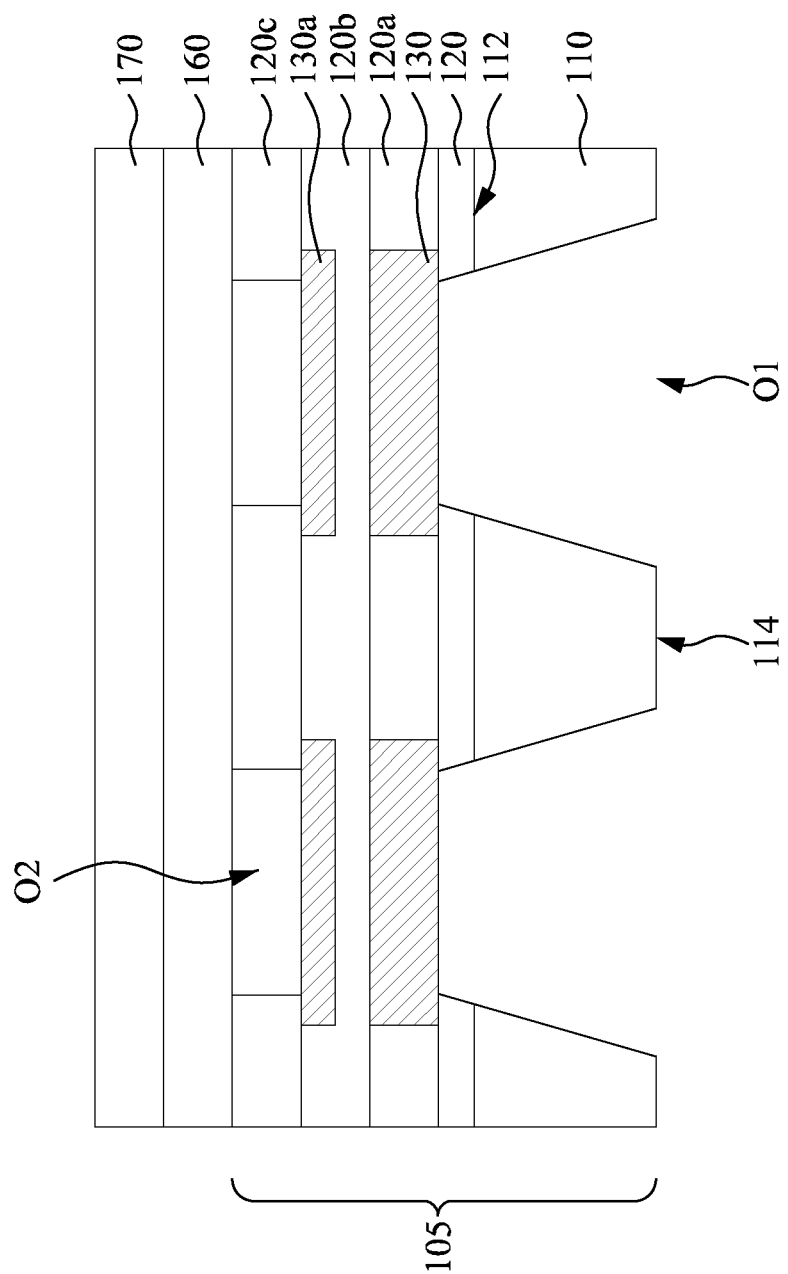

As shown in FIG. 12, after forming the through hole O1 of the substrate 110 of FIG. 11, the first isolation layer 120 in the through hole O1 may be etched to expose the lower ground pad 130. When the substrate 110 is a SOI substrate, as shown in FIG. 6, after the through hole O1 is formed by etching the substrate 110a, the inner isolation layer 113, the portion 111 of the substrate 110a, and the first isolation layer 120 in the through hole O1 may be etched to expose the lower ground pad 130.

Figure 13:
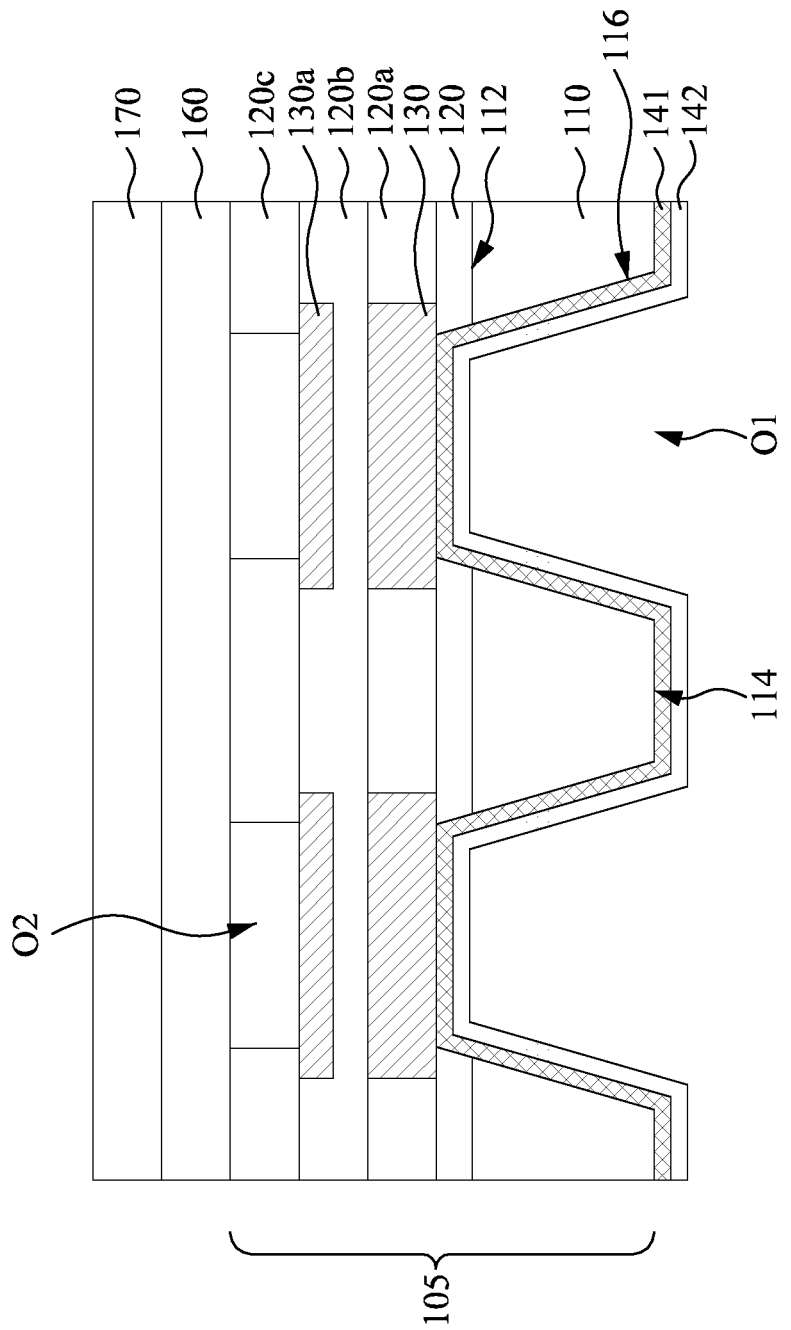

Referring to FIG. 13, after etching the first isolation layer 120 in the through hole O1, a seed layer 142 extending from the bottom surface 114 of the substrate 110 to the lower ground pad 130 along the sidewall 114 may be formed. The material of the seed layer 142 may be copper. Before the formation of the seed layer 142, a titanium layer 141 may be formed to serve as a buffer layer.

Figure 14:
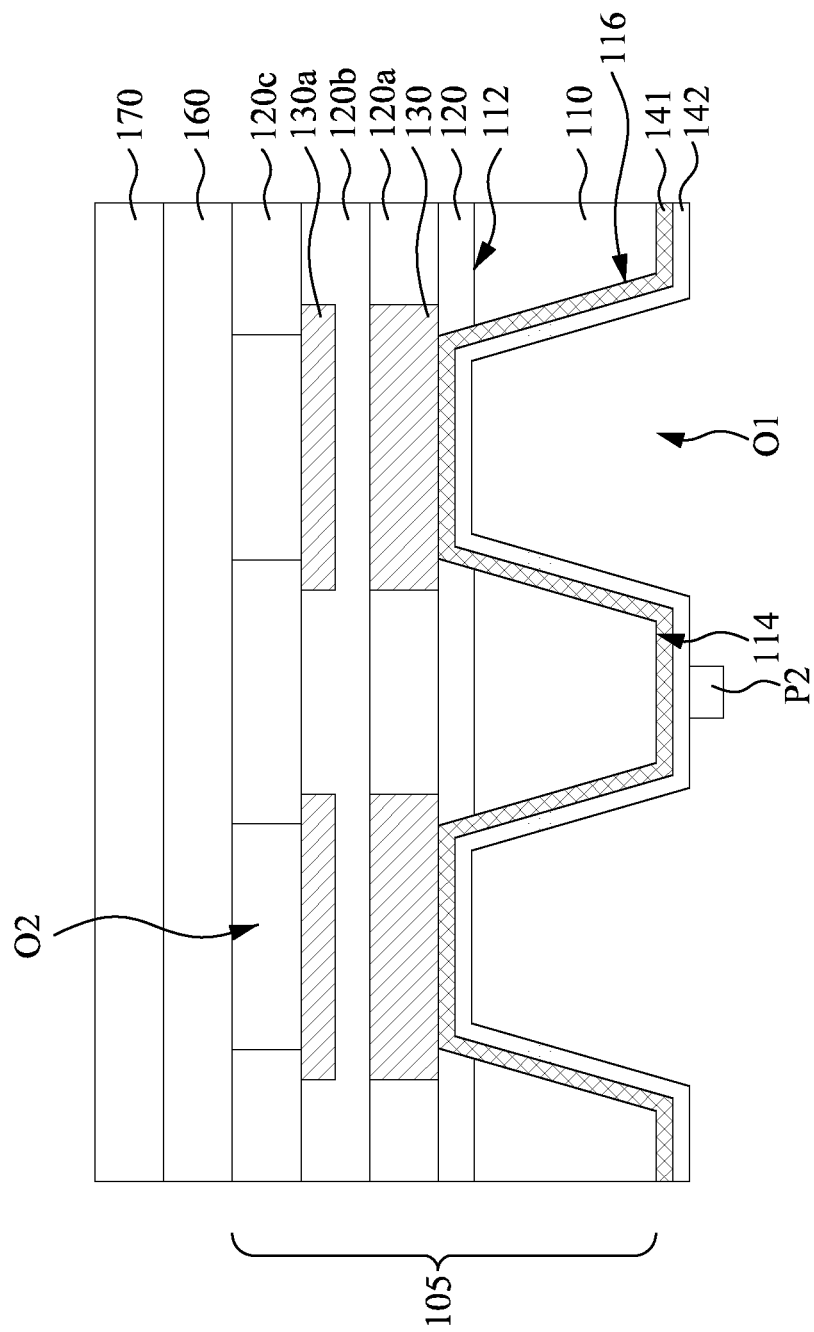
Figure 15:
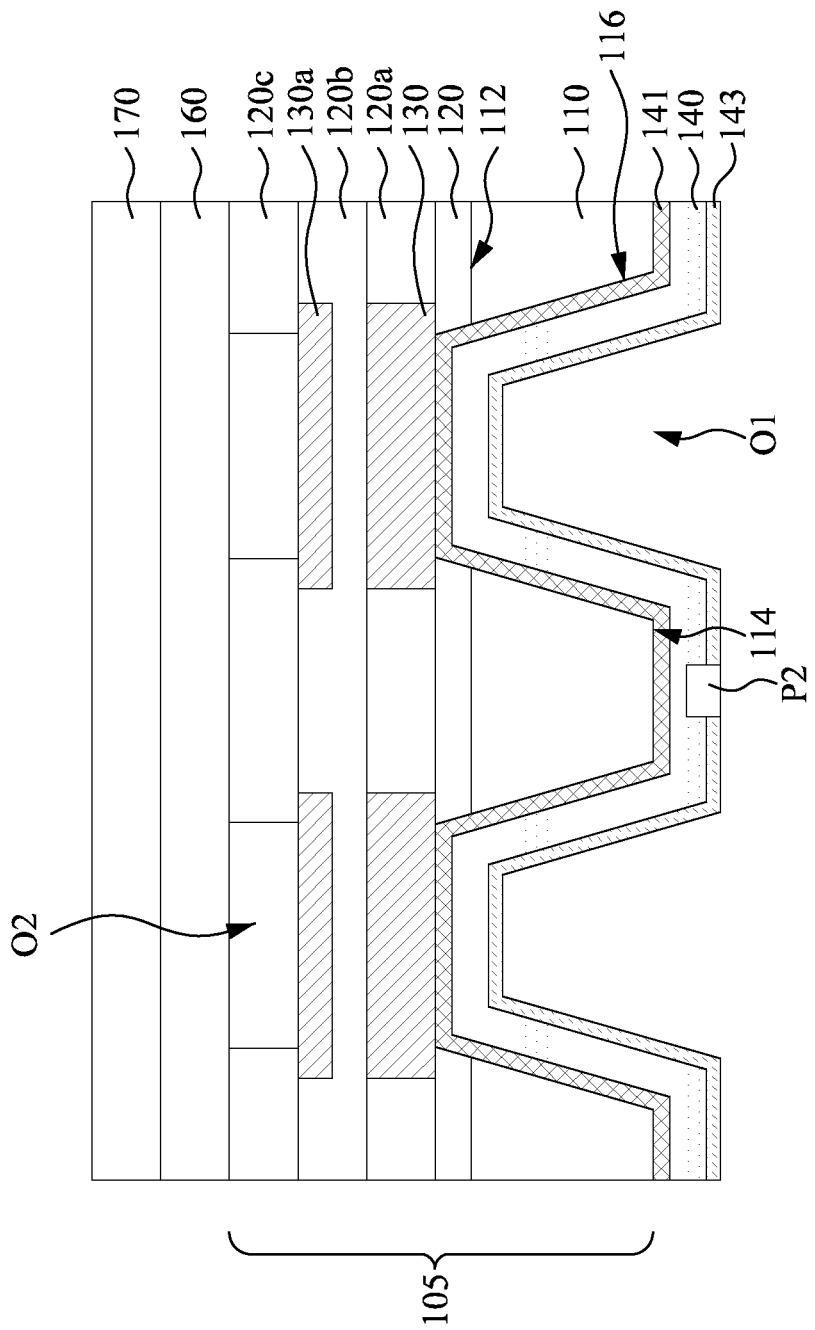

As shown in FIG. 14 and FIG. 15, after forming the seed layer 142, a photoresist P2 may be formed on the seed layer 142 that is on the bottom surface 114 of the substrate 110. Thereafter, the redistribution layer 140 extending from the bottom surface 114 of the substrate 110 to the lower ground pad 130 along the sidewall 116 may be formed, in which the redistribution layer 140 covers the entire bottom surface 114 of the substrate 110 and electrically connects the lower ground pad 130. In this embodiment, the redistribution layer 140 is formed on the seed layer 142 not covered by the photoresist P2 using an electroplating method. The redistribution layer 140 and the seed layer 142 may be made of the same material so as to have no interface therebetween, and thus merely the redistribution layer 140 will be described below. In addition, after forming the redistribution layer 140, a diffusion barrier layer 143 may be formed on the redistribution layer 140. The material of the barrier layer 143 may be, but not limited to nickel.

Figure 16:
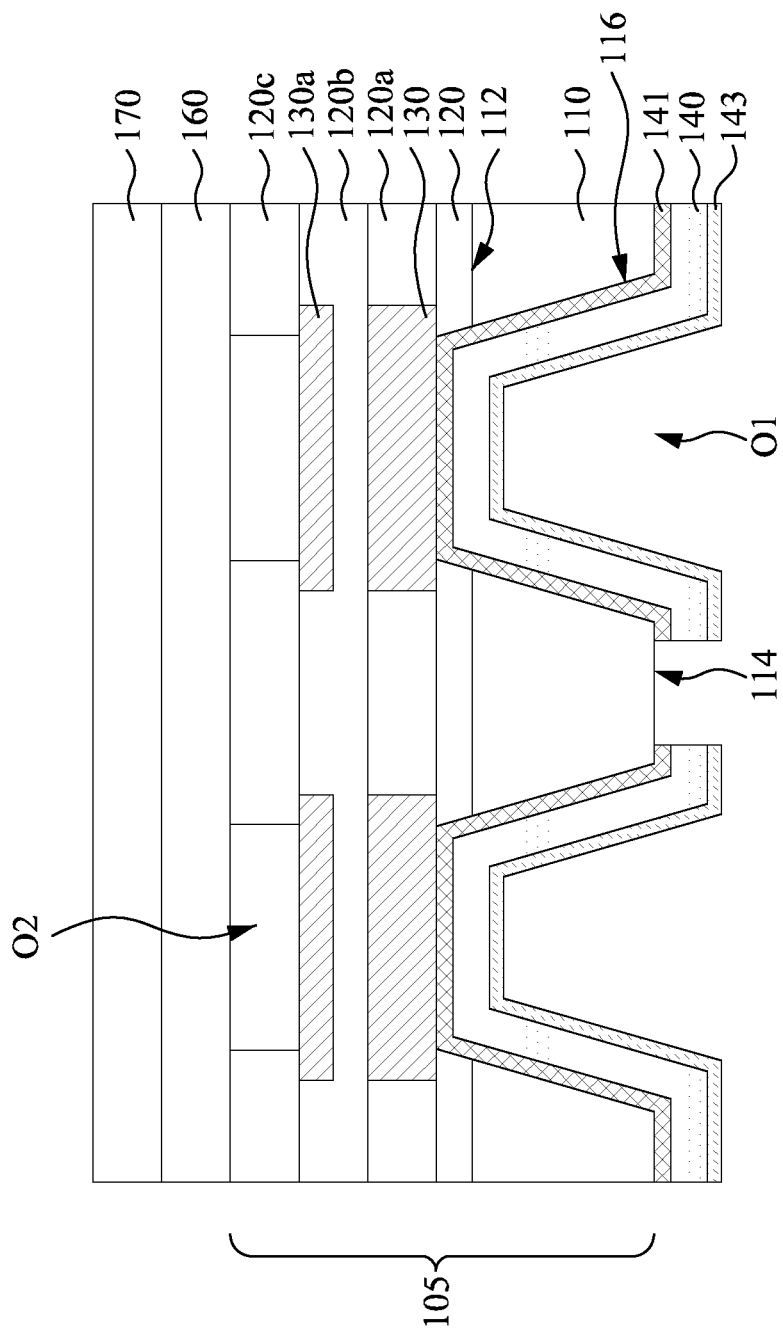
Figure 17:
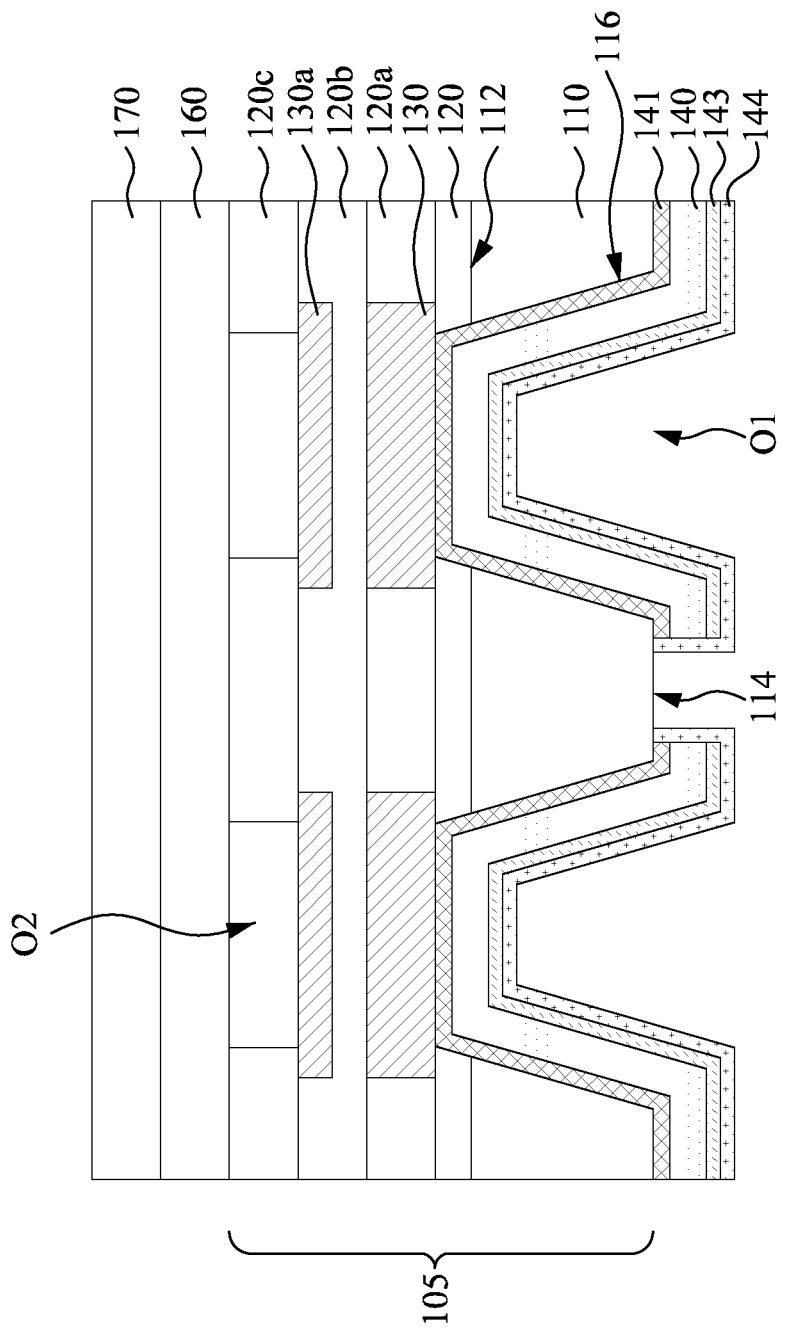

As shown in FIG. 16 and FIG. 17, thereafter, the photoresist P2 and the seed layer 142 covered by the photoresist P2 may be removed, and an antioxidant layer 144 is formed on the redistribution layer 140. Specifically, the antioxidant layer 144 is formed on the barrier layer 143, and covers sidewalls of the titanium layer 141, the redistribution layer 140, and the barrier layer 143. The material of the antioxidant layer 144 may be, but not limited to gold.

Figure 18:
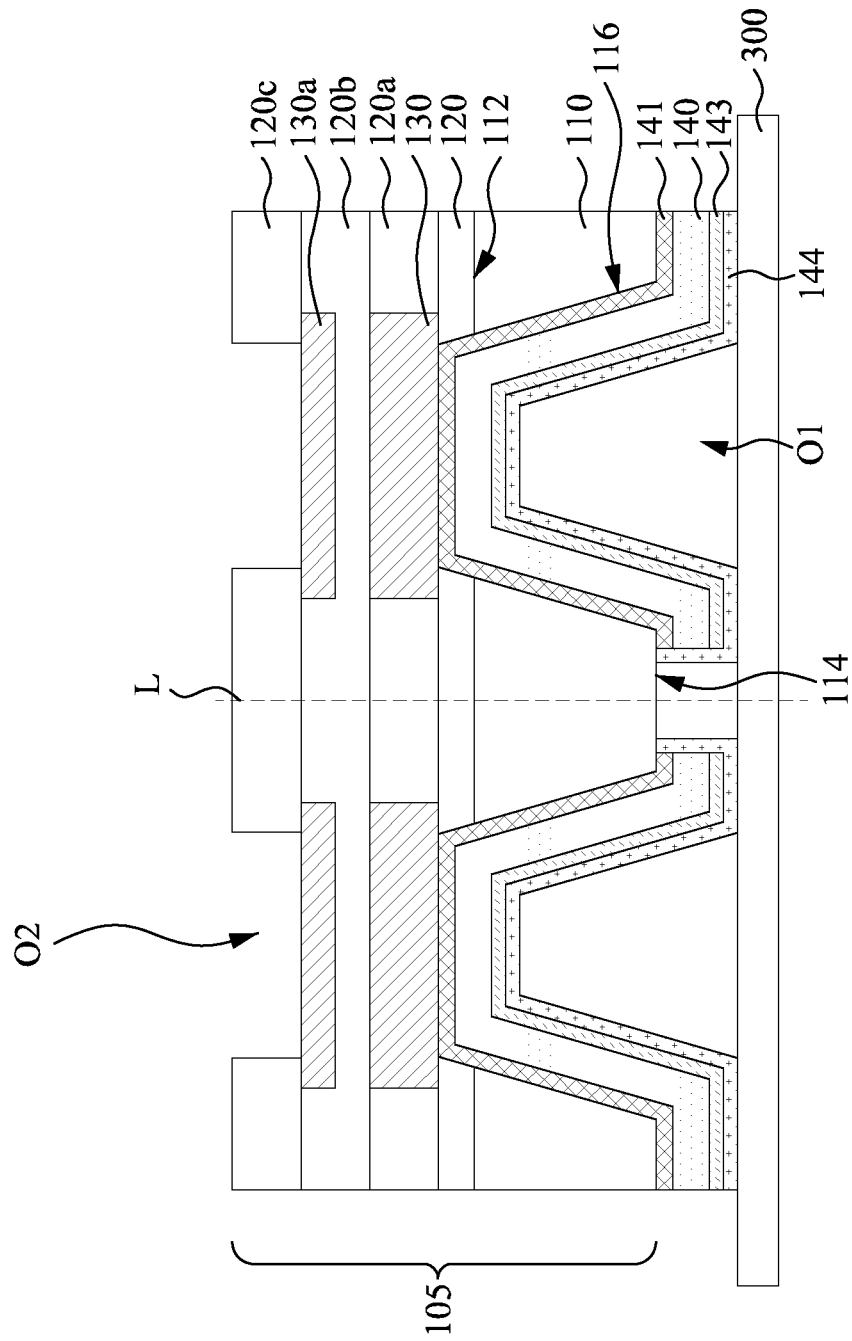

Referring to FIG. 18, in the following manufacturing process, the structure of FIG. 17 may be adhered to a supporting layer 300 (e.g., dicing tape). Thereafter, the temporary bonding layer 160 and the carrier 170 may be removed, and then the semiconductor structure 105 may be diced along a line L to form the chip package 100 shown in FIG. 2. In some embodiments, the chip package 100 of FIG. 2 may further have the fourth isolation layer 120c of FIG. 18.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package, comprising:
   a semiconductor structure having a substrate, a first isolation layer, a second isolation layer, a third isolation layer, an upper ground pad, and a lower ground pad, wherein the substrate has a top surface, a bottom surface opposite to the top surface, a through hole through the top surface and the bottom surface, and a sidewall surrounding the through hole, the first isolation layer is located on the top surface of the substrate, and the lower ground pad is located on the through hole, the second isolation layer is located on the first isolation layer and surrounds the lower ground pad, the third isolation layer is located on the second isolation layer, the upper ground pad is embedded in the third isolation layer and electrically connected to the lower ground pad, and the upper ground pad is free of conductive lines; and
   a redistribution layer extending from the bottom surface of the substrate to the lower ground pad along the sidewall, wherein the redistribution layer covers the entire bottom surface of the substrate and electrically connects the lower ground pad.

2. The chip package of claim 1, wherein an included angle between the first isolation layer and the lower ground pad of the semiconductor structure is greater than or equal to 90 degrees.

3. The chip package of claim 1, wherein the substrate further comprises an inner isolation layer, and a portion of the substrate is located between the first isolation layer and the inner isolation layer.

4. The chip package of claim 3, wherein a thickness of said portion of the substrate is less than half of sum of thicknesses of the first isolation layer and the inner isolation layer.

5. The chip package of claim 1, wherein the semiconductor structure further comprises:
   a fourth isolation layer located on the third isolation layer and having an opening, wherein the upper ground pad is located in the opening.

6. The chip package of claim 1, wherein the upper ground pad overlaps the lower ground pad in a vertical direction.

7. The chip package of claim 1, wherein the semiconductor structure further comprises:
   a functional conductive pad embedded in the third isolation layer and electrically isolated from the lower ground pad.

8. The chip package of claim 1, wherein the substrate further comprises a semiconductor layer and a buffer layer, and the semiconductor layer is located between the first isolation layer and the buffer layer.

9. A manufacturing method of a chip package, comprising:
   bonding, by a temporary bonding layer, a carrier to a semiconductor structure, wherein the semiconductor structure has a substrate, a first isolation layer, a second isolation layer, a third isolation layer, an upper ground pad, and a lower ground pad, and the substrate has a top surface and a bottom surface opposite to the top surface, the second isolation layer is located on the first isolation layer and surrounds the lower ground pad, the third isolation layer is located on the second isolation layer, the upper ground pad is embedded in the third isolation layer and electrically connected to the lower ground pad, and the upper ground pad is free of conductive lines;
   etching the substrate to form a through hole through the top surface and the bottom surface, such that the substrate has a sidewall surrounding the through hole;
   etching the first isolation layer in the through hole to expose the lower ground pad;
   forming a redistribution layer extending from the bottom surface of the substrate to the lower ground pad along the sidewall, wherein the redistribution layer covers the entire bottom surface of the substrate and electrically connects the lower ground pad; and
   removing the temporary bonding layer and the carrier.

10. The manufacturing method of the chip package of claim 9, further comprising:

after bonding the carrier to the semiconductor structure, grinding the bottom surface of the substrate.

11. The manufacturing method of the chip package of claim 9, further comprising:
etching the substrate again to laterally expand the through hole after the through hole is formed.

12. The manufacturing method of the chip package of claim 9, further comprising:
after etching the first isolation layer in the through hole, forming a seed layer extending from the bottom surface of the substrate to the lower ground pad along the sidewall; and
forming a photoresist on the seed layer on the bottom surface of the substrate.

13. The manufacturing method of the chip package of claim 12, wherein forming the redistribution layer comprises using an electroplating method to form the redistribution layer on the seed layer that is not covered by the photoresist.

14. The manufacturing method of the chip package of claim 13, further comprising:
after forming the redistribution layer, removing the photoresist.

15. The manufacturing method of the chip package of claim 14, further comprising:
after removing the photoresist, forming an antioxidant layer on the redistribution layer.

16. The manufacturing method of the chip package of claim 9, wherein the semiconductor structure further comprises an inner isolation layer, and a portion of the substrate is located between the first isolation layer and the inner isolation layer, and the manufacturing method further comprises:
after etching the substrate to form the through hole, etching the inner isolation layer in the through hole, the portion of the substrate, and the first isolation layer to expose the lower ground pad.

17. The manufacturing method of the chip package of claim 9, further comprising:
after removing the temporary bonding layer and the carrier, dicing the semiconductor structure.

* * * * *